United States Patent [19]

Hiroki

[11] Patent Number: 5,306,380
[45] Date of Patent: Apr. 26, 1994

[54] VACUUM PROCESSING APPARATUS

[75] Inventor: Tutomu Hiroki, Yamanashi, Japan

[73] Assignees: Tokyo Electron Limited, Tokyo; Tokyo Electron Yamanashi Limited, Nirasaki, both of Japan

[21] Appl. No.: 53,389

[22] Filed: Apr. 28, 1993

[30] Foreign Application Priority Data

Apr. 28, 1992 [JP] Japan .................................. 4-110506

[51] Int. Cl.⁵ .................... B44C 1/22; H01L 21/306; B66C 23/00
[52] U.S. Cl. ............................ 156/345; 156/643; 156/662; 414/744.5
[58] Field of Search .............. 156/345, 643, 646, 657, 156/662; 414/217, 744.1, 744.2, 744.5; 204/298.35; 118/719

[56] References Cited

U.S. PATENT DOCUMENTS

| | | | |
|---|---|---|---|
| 4,661,196 | 4/1987 | Hockersmith et al. | 156/345 |
| 4,715,921 | 12/1987 | Maher et al. | 156/345 |
| 5,138,973 | 8/1992 | Davis et al. | 156/345 X |
| 5,164,034 | 11/1992 | Arai et al. | 156/345 |

Primary Examiner—William Powell
Attorney, Agent, or Firm—Oblon, Spivak, McClelland, Maier & Neustadt

[57] ABSTRACT

A vacuum processing apparatus for LCD substrates comprises three process chambers. Each of these process chambers is connected to a first load lock chamber via a gate. A second load lock chamber is connected to the first load lock chamber via another gate. A transfer member arranged under the air atmosphere is located to face the second load lock chamber. A retractable arm for transferring a substrate between each of the process chambers and the second load lock chamber is arranged within the first load lock chamber. Also arranged within the first load lock chamber is a storing member for temporarily storing the substrate. These storing member and the arm are supported by a rotatable base. The storing member has four different height levels for supporting the substrate, and is moved in a vertical direction.

16 Claims, 7 Drawing Sheets

VACUUM PROCESSING APPARATUS

BACKGROUND OF THE INVENTION

1. Field of the Invention

The present invention relates to a vacuum processing apparatus, particularly, to an improvement in the transfer arm arranged in a load lock chamber used in a processing apparatus of an LCD substrate.

2. Description of the Related Art

In the manufacture of a semiconductor device or a liquid crystal display device (LCD), it was customary to use a so-called multi-chamber type vacuum processing apparatus provided with a plurality of vacuum process chambers in which predetermined treatments such as an etching treatment and an ashing treatment are applied under an atmosphere of a reduced pressure to a semiconductor wafer or an LCD substrate.

In the conventional vacuum processing apparatus of this type, a plurality of, e.g., three, vacuum process chambers are arranged around a preliminary vacuum chamber, i.e., load lock chamber, in which is arranged a substrate transfer mechanism such as a transfer arm. The workpiece such as an LCD substrate or the like is put in each vacuum process chamber by the transfer arm arranged within the load lock chamber for application of a predetermined treatment to the workpiece within the vacuum process chamber. The transfer arm is also utilized for taking the workpiece after the treatment out of the vacuum process chamber.

However, where a single transfer arm is used for transferring the workpiece in and out of the process chamber, the through-put of the vacuum processing apparatus is lowered. To overcome the difficulty, it is proposed to arrange, for example, two transfer arms in two states within a load lock chamber. If a plurality of transfer arms are arranged within the load lock chamber, however, it is unavoidable for the load lock chamber to be enlarged. It is also unavoidable for the vacuum process chamber, into which the transfer arms are inserted, to be enlarged. It follows that the entire vacuum processing apparatus is rendered bulky, leading to an increased manufacturing cost. What should also be noted is that the transfer arm causes dust generation. Naturally, it is not desirable to increase the number of transfer arms.

SUMMARY OF THE INVENTION

An object of the present invention is to provide a vacuum processing apparatus which permits improving the through-put without bringing about an enlargement of the apparatus and an increase in the manufacturing cost.

According to a first aspect of the present invention, there is provided a vacuum processing apparatus, comprising: a first process chamber in which a predetermined treatment is applied to a substrate to be processed under an atmosphere of a reduced pressure; a first mount for supporting the substrate within the first process chamber; a second process chamber in which a treatment is applied to the substrate under an atmosphere of a reduced pressure; a second mount for supporting the substrate within the second process chamber; a load lock chamber connected via a gate to each of the first and second process chambers; a storing member for holding the substrate within the load lock chamber; a retractable arm arranged within the load lock chamber for transferring the substrate among the first and second mounts and the storing member; and an arm support member supporting the arm and serving to drive the arm to selectively face the first and second process chambers.

According to a second aspect of the present invention, there is provided a vacuum processing apparatus, comprising: a process chamber in which a treatment is applied to a substrate to be processed under an atmosphere of a reduced pressure; a mount for supporting the substrate within the process chamber; a waiting section for the substrate to be ready; a holding member arranged within the waiting section for holding the substrate ready; a load lock chamber connected via a gate to each of the processing chamber and the waiting section; a storing member for holding the substrate within the load lock chamber, the storing member having a plurality of levels for supporting a plurality of substrates; a retractable arm arranged within the load lock chamber for transferring the substrate among the mount, the holding member and the storing member; an arm support member supporting the storing member and the arm and rotatable together with these storing member and arm, the arm support member serving to drive the arm to selectively face the process chamber and the waiting section; and driving means for driving the storing member in vertical direction in relation to the arm support member, the storing member being supported by the arm support member through the driving means.

In the vacuum processing apparatus of the present invention, an arm for putting and taking a substrate, such as an LCD substrate, in and out of a process chamber is arranged within a load lock chamber together with a storing member constructed to be capable of holding the substrate. The particular construction of the present invention permits efficiently putting and taking the substrate in and out of the process chamber in a short time. Where, for example, a substrate after treatment is taken out of the process chamber and a new substrate is put in the process chamber, the new substrate is disposed on the storing member. Alternatively, the substrate taken out of the process chamber is disposed on the storing member. Since the storing member is arranged within the load lock chamber, the apparatus of the present invention makes it possible to suppress an enlargement of the apparatus and to suppress an increase in the manufacturing cost, compared with the apparatus including a plurality of arms. In addition, the apparatus of the present invention permits suppressing dust generation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The accompanying drawings collectively show a vacuum processing apparatus according to an embodiment of the present invention. The apparatus of the embodiment shown in these drawings is adapted for use in an etching treatment or an ashing treatment applied to an LCD substrate.

Figure 1:
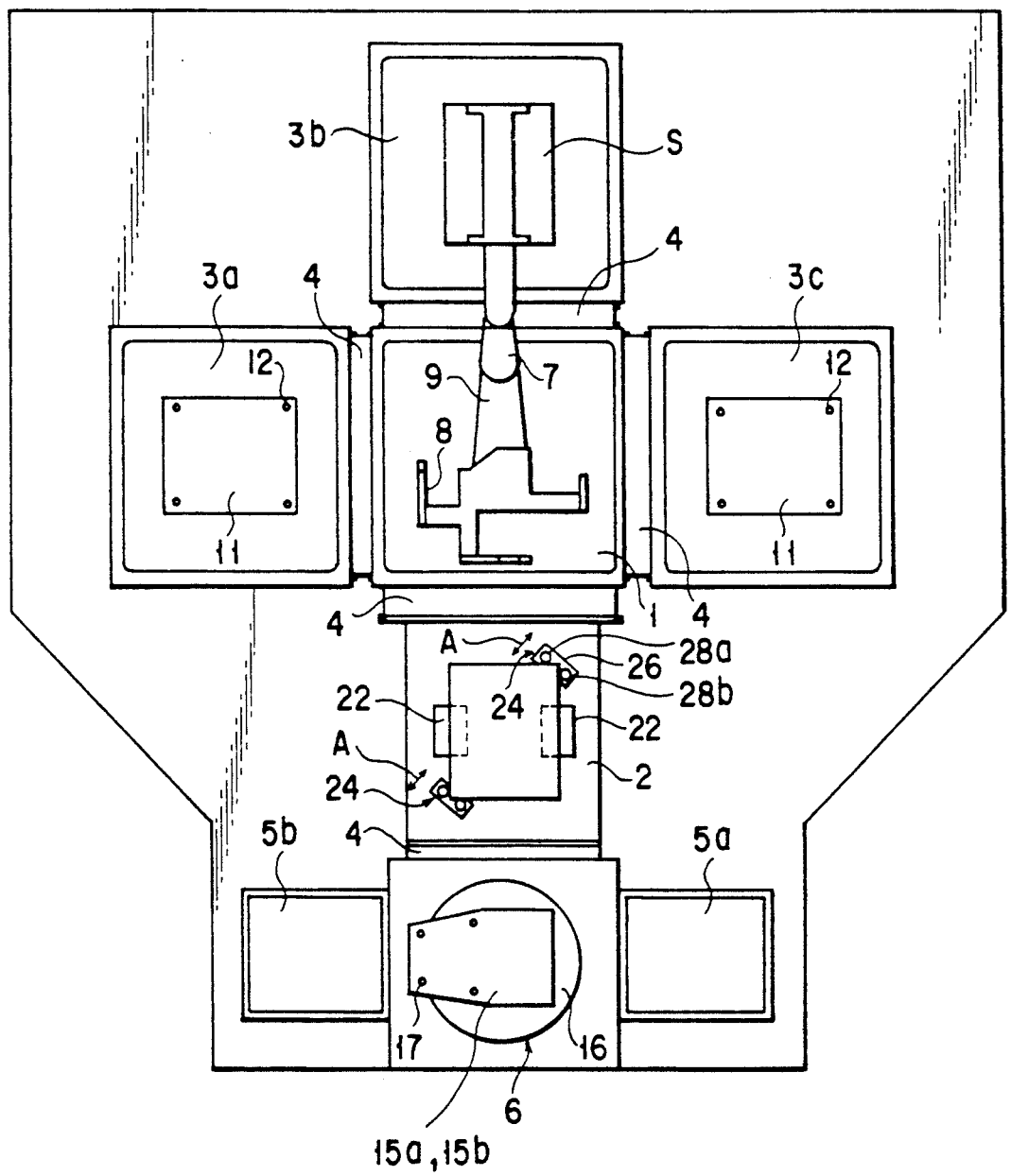
FIG. 1 is a plan view schematically showing the construction of a vacuum processing apparatus according to an embodiment of the present invention.

As shown in FIG. 1, the vacuum processing apparatus of the present invention comprises a first load lock chamber (vacuum chamber) 1 and a second load lock chamber 2 located adjacent to the first load lock chamber 1. A plurality of, e.g., three, vacuum process chambers 3a, 3b and 3c are arranged in the vicinity of the first load lock chamber 1. A gate valve 4 is provided in each of the open communicating regions between the first load lock chamber 1 and the second load lock chamber 2, between the first load lock chamber 1 and the vacuum process chamber 3a, between the first load lock chamber 1 and the vacuum process chamber 3b, between the first load lock chamber 1 and the vacuum process chamber 3c, and between the second load lock chamber 2 and an external region. Each of these gate valves 4 is constructed to be capable of hermetically closing and opening the communicating region.

A mount 11 for supporting an LCD substrate S is arranged within each of the process chambers 3a, 3b and 3c. Projectable pins 12 for supporting the substrate S are provided at four corner portions of the mount 11.

A transfer member 6 is arranged outside (in the lower portion in FIG. 1) the second load lock chamber 2. The transfer member 6 is put under the air atmosphere. Vertically movable tables (not shown) for supporting cassettes each housing LCD substrates are arranged on both sides of the transfer member 6. FIG. 1 shows the state that cassettes 5a and 5b are disposed on these vertically movable tables, respectively. Substrates which are to be treated are housed in, for example, the cassette 5a, with substrates after treatment being housed in the cassette 5b.

The transfer member 6 comprises arms 15a and 15b superposed one upon the other and a base 16 for rotatably supporting these arms. These arms 15a, 15b are integrally moved forward and backward by the base 16. Each of these arms 15a and 15b is provided with four projections 17 for supporting the substrate. The projection 17 is formed of an elastic material having a high friction coefficient such as a synthetic resin for preventing the substrate from slipping or sliding off. It should be noted that the two arms 15a and 15b of the transfer member 6 permit transferring two substrates at a time. To be more specific, two substrates are taken at a time out of, for example, the cassette 5a by the arms 15a and 15b of the transfer member 6. Likewise, two substrates after treatment are simultaneously put in the cassette 5b. The height of each of these cassettes 5a and 5b is adjusted by the vertically movable table to determine the positions at which the substrates are taken out of or put in these cassettes.

A pair of racks 22 are arranged within the second load lock chamber 2 and respectively have two height levels corresponding to the vertical positions of the arms 15a, 15b of the transfer member 6. Naturally, two LCD substrates are simultaneously held within the second load lock chamber 2 by these racks 22. The racks 22 are movable in the vertical direction, and one of the two substrates held by these racks 22 is selectively taken out by a substrate transfer arm 7 which is described herein later.

A pair of positioners 24 for aligning the substrate are arranged within the second load lock chamber 2. These positioners 24 are provided to face each other on an extension line of the diagonal of substrates disposed within the second load lock chamber 2. Each positioner 24 comprises a base 26 movable in a direction denoted by an arrow A and a pair of rollers 28a, 28b rotatably supported on the base 26. The two substrates held by the racks 22 are diagonally moved by the positioners 24 for the alignment. Further, optical sensors (not shown) for confirming the substrate alignment are disposed within the second load lock chamber 2.

Figure 2:
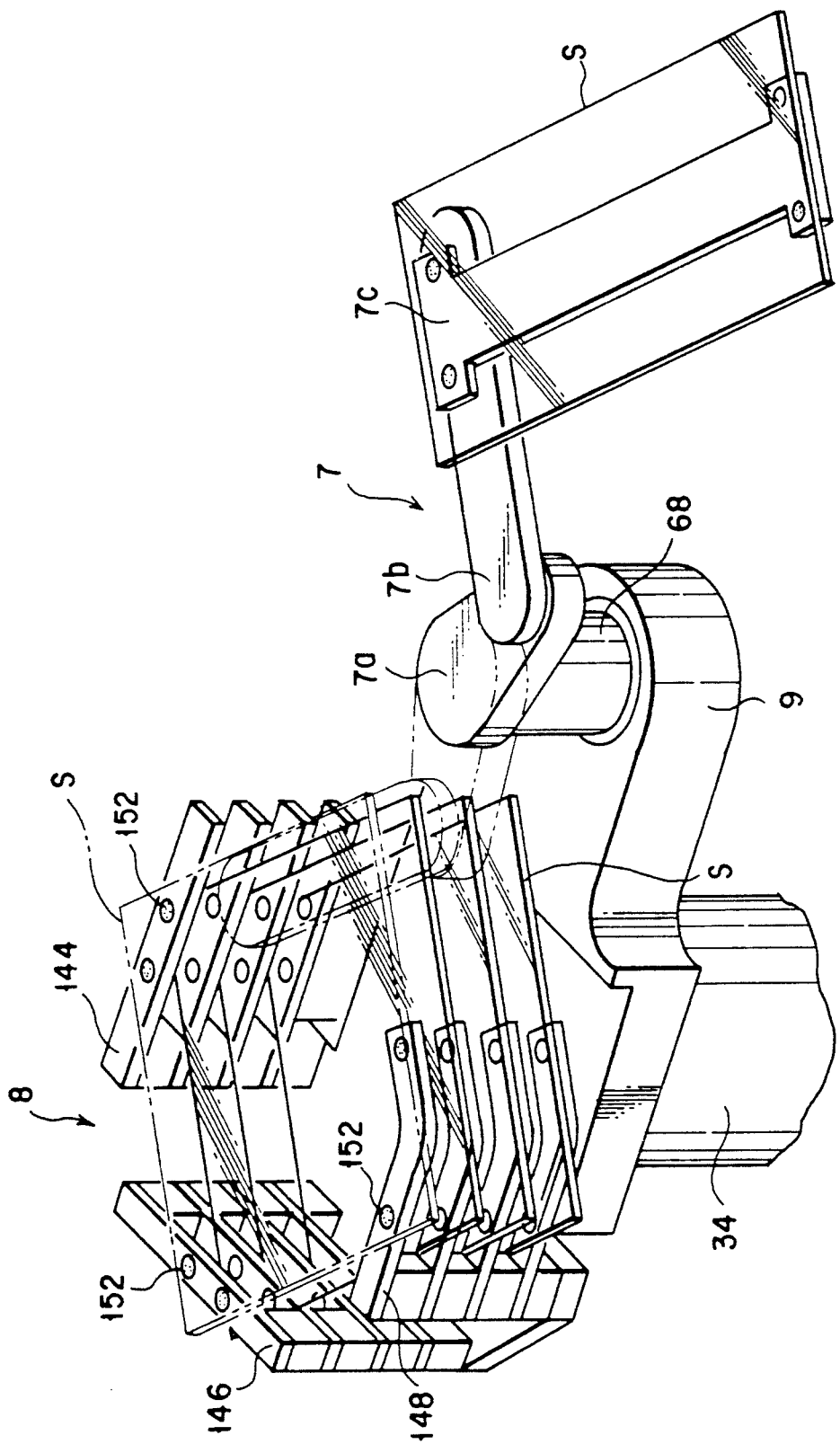
FIG. 2 is a perspective view showing in a magnified fashion a transfer arm for transferring LCD substrates and a storing member for storing LCD substrates, which are included in the apparatus shown in FIG. 1.

The substrate transfer arm 7 referred to previously is arranged within the first load lock chamber 1 together with a storing member 8 constructed to be capable of holding a plurality of LCD substrates. As shown in FIG. 2, these arm 7 and the storing member 8 are supported by a rotatable base 9.

Figure 3:
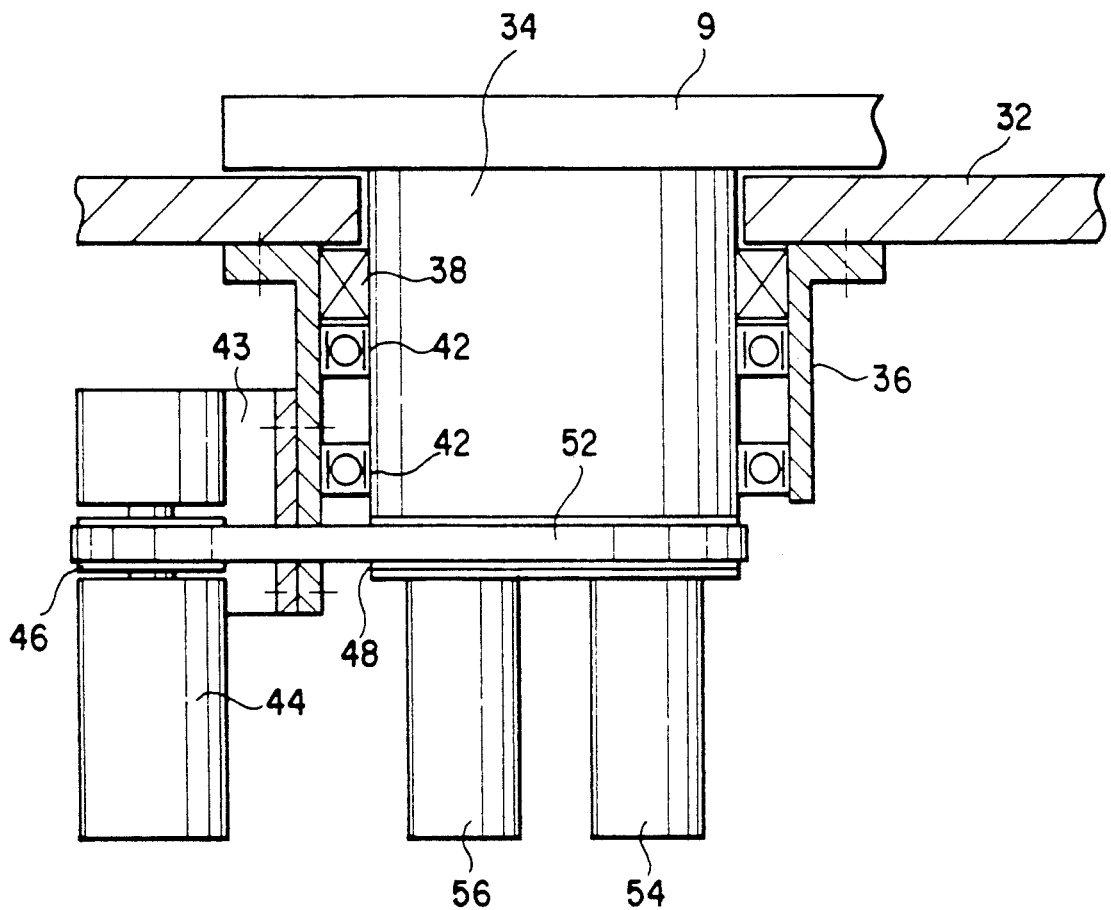
FIG. 3 shows in a magnified fashion a driving mechanism of a base which supports the arm and the storing member included in the apparatus shown in FIG. 1.

FIG. 3 schematically shows the driving system of the base 9. As seen from the drawing, the base 9 is fixed to the upper end of a cylinder 34 extending through a floor 32 of the first load lock chamber 1. That portion of the cylinder 34 which is positioned below the floor 32 is covered with a cylindrical cover member 36 fixed to the floor 32. A seal 38, e.g., a magnetic fluid seal, and bearings 42 are arranged in the space between the cylinder 34 and the cover member 36. A motor 44 is fixed to the cover member 36 via a frame 43. A pulley 46 mounted to an output shaft of the motor 44 is connected to a pulley 48 arranged below the cylinder 34 via a timing belt 52. It follows that the cylinder 34 and the base 9 are driven by the motor 44.

A motor 54 for driving the arm 7 and another motor 56 for vertically moving the storing member 8 are mounted to a lower portion of the cylinder 34. When the cylinder 34 is rotated, these motors 54 and 56 are rotated together with the cylinder 34.

Figure 4:
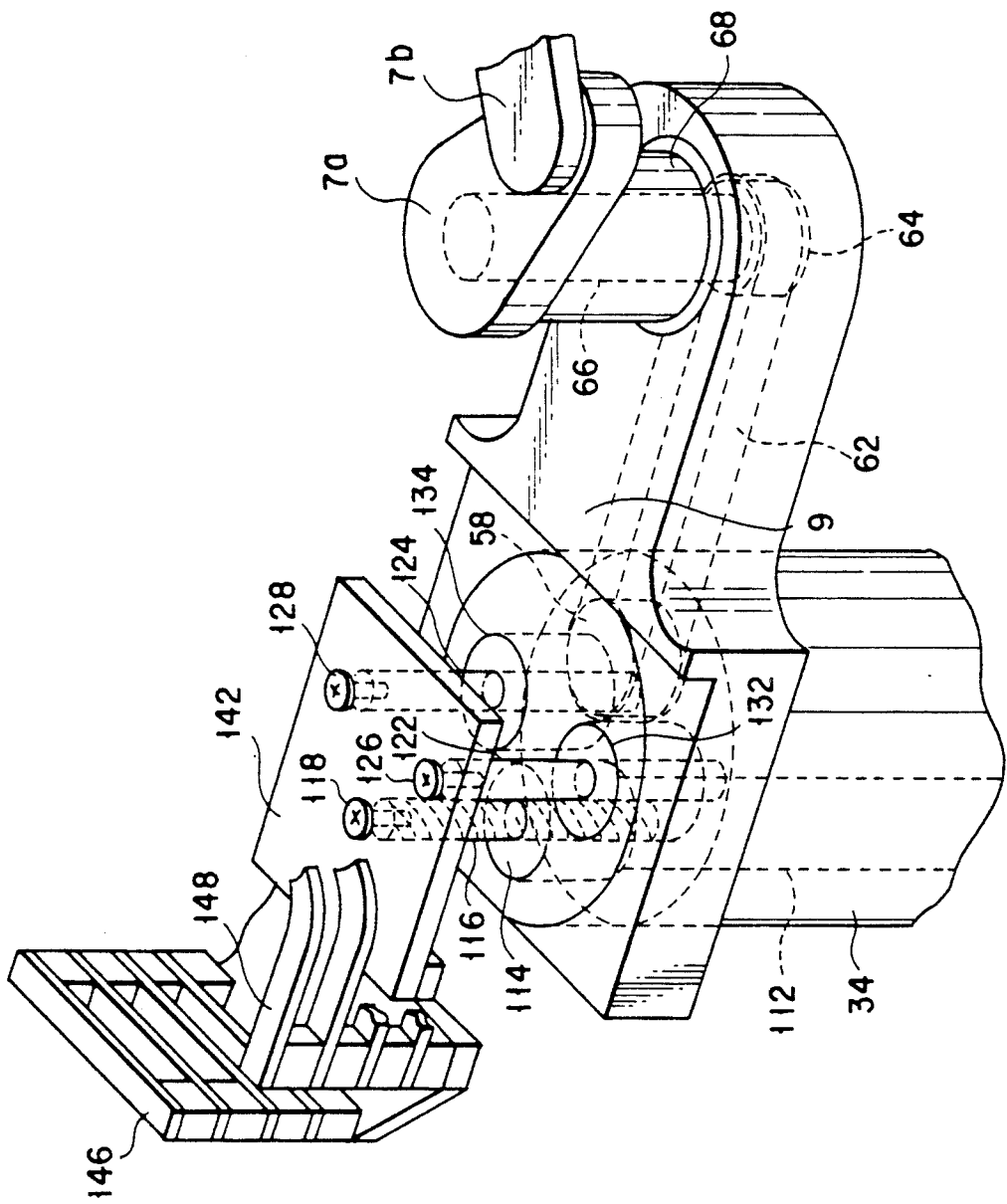
FIG. 4 is a perspective view showing in a magnified fashion the driving mechanism of the arm and the storing member included in the apparatus shown in FIG. 1.

As shown in FIG. 4, the output shaft of the motor 54 is connected to a pulley 58 arranged within the base 9. A timing belt 62 arranged within the base 9 is engaged with the pulley 58 and with another pulley 64 arranged at the tip portion of the base where the arm 7 is connected.

Figure 5:
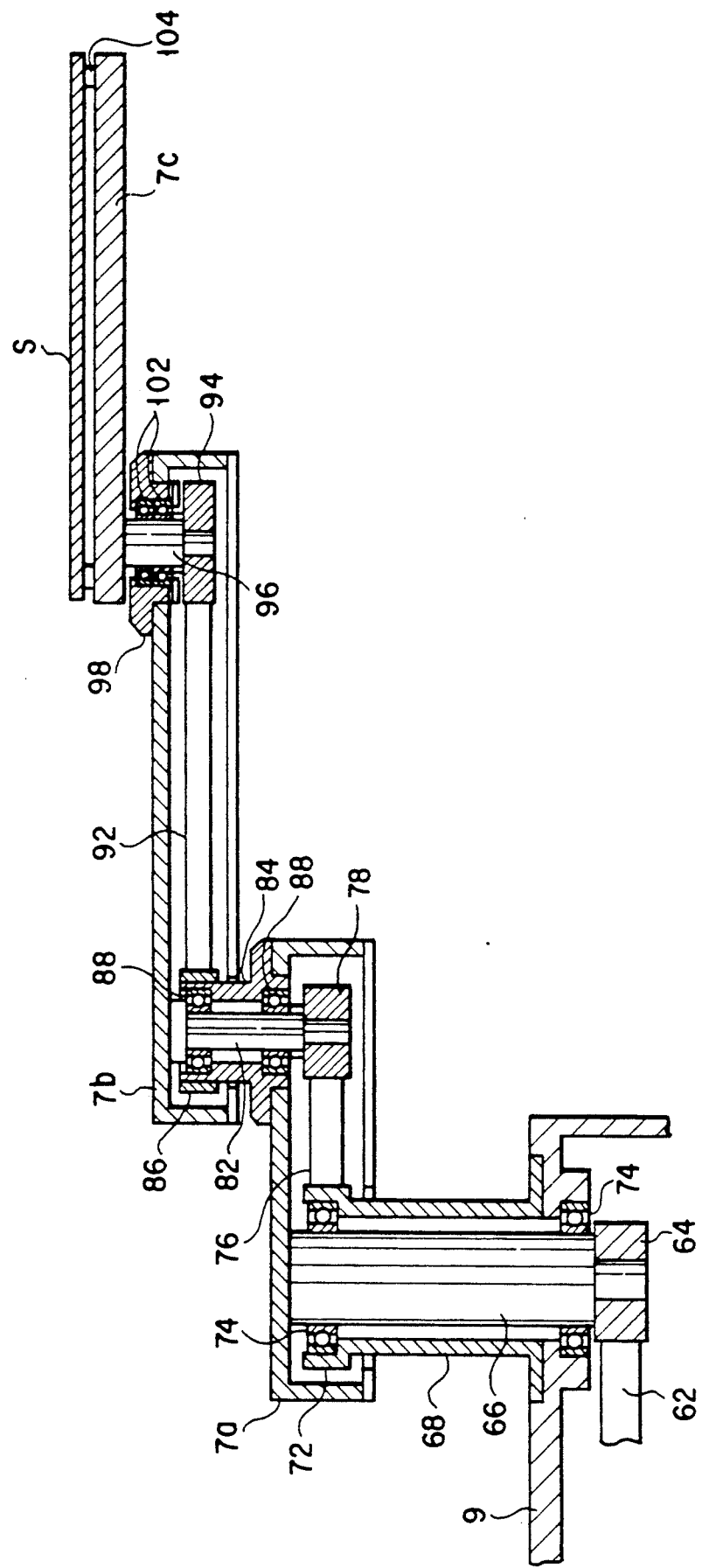
FIG. 5 is a cross sectional view showing in a magnified fashion the internal structure of the arm included in the apparatus shown in FIG. 1.

As shown in FIG. 5, the pulley 64 is fixed to the lower end portion of a shaft 66 acting as the rotating shaft of a first arm element 7a of the arm 7. The upper end portion of the shaft 66 is fixed to the first arm element 7a. A cylindrical cover 68 is disposed to cover the shaft 66. The lower end portion of the cover 68 is fixed to the base 9, and a pulley 72 is arranged at the upper end portion of the cover 68. Further, bearings 74 are disposed within the space defined by the shaft 66, the base 9 and the cover 68.

A timing belt 76 arranged within the first arm element 7a is engaged with the pulley 72 and with another pulley 78 arranged at the tip portion of the first arm element 7a where a second arm element 7b is connected to the first arm element. The pulley 78 is fixed to the lower end portion of a shaft 82 acting as a rotating shaft of the second arm element 7b. The upper end portion of the shaft 82 is fixed to the second arm element 7b. A cylindrical cover 84 is disposed to cover the shaft 82. The lower end portion of the cover 84 is fixed to the first arm element 7a, and the pulley 86 is mounted to the upper end portion of the cover 84. Further, bearings 88 are disposed between the shaft 82 and the cover 84.

A timing belt 92 arranged within the second arm element 7b is engaged with the pulley 86 and with another pulley 94 mounted at the tip portion of the second arm element 7b where a third arm element 7c is connected to the second arm element 7b. The pulley 94 is mounted at the lower end portion of a shaft 96 acting as a rotating shaft of the third arm element 7c. The upper end portion of the shaft 96 is fixed to the third arm element 7c. A cylindrical cover 98 is disposed to cover the shaft 96. The lower end portion of the cover 98 is fixed to the second arm element 7b. Further, bearings 102 are disposed between the shaft 96 and the cover 98.

The third arm element 7c is I-shaped as shown in FIG. 2. Four projections 104 for supporting the substrate S are mounted at end portions of the third arm element 7c. Each of these projections 104 is formed of an elastic material having a high frictional coefficient such as a synthetic rubber so as to prevent the substrate supported thereon from slipping or sliding off. An operation of the arm 7 will be described herein later.

Returning back to FIGS. 3 and 4, the output shaft of the motor 56 for driving the storing member 8 is joined to cylindrical hollow shaft 112 extending within the cylinder 34 in its axial direction. An internally threaded cylinder 114 is fixed to the upper portion of the hollow shaft 112. The internally threaded cylinder 114 is exposed to the outside from the base 9, and a shaft 116 having a ball screw formed therein is engaged with the exposed portion of the internally threaded cylinder 114 The top portion of the shaft 116 is fixed to a bottom plate 142 of the storing member 8 by a screw 118.

Linear guiding shafts 122 and 124 are fixed to the bottom plate 142 of the storing member 8 by screws 126 and 128. These shafts 122 and 124 extend through the central holes of guide cylinders 132 and 134, respectively, buried in the base 9 to reach the inner region of the cylinder 34. It follows that, if the internally threaded cylinder 114 is rotated by the motor 56, the linear guide shafts 122 and 124 act as a mechanism for stopping the rotation, with the result that the screw shaft 116 is moved up or down together with the storing member 8 and shafts 122 and 124 relative to the base 9.

As shown in FIG. 2, three sets of supporting frames 144, 146 and 148, which are mounted to the bottom plate 142, are provided in the storing member 8. Each of these supporting frames 144, 146 and 148 forms four stages of flat levels, with the result that four LCD substrates are housed at a time in these supporting frames. Supporting plates constituting each of the flat levels of these supporting frames are provided with projections 152 for supporting the substrate. Each of the projection 152 is formed of an elastic material having a high frictional coefficient such as a synthetic rubber so as to prevent the substrate supported thereon from slipping or sliding off.

FIGS. 6A to 6E show how to use the arm 7 and the storing member 8. These drawings cover the case where the substrate S is moved by the arm 7 from the process chamber 3a to the process chamber 3c.

Figure 6A:
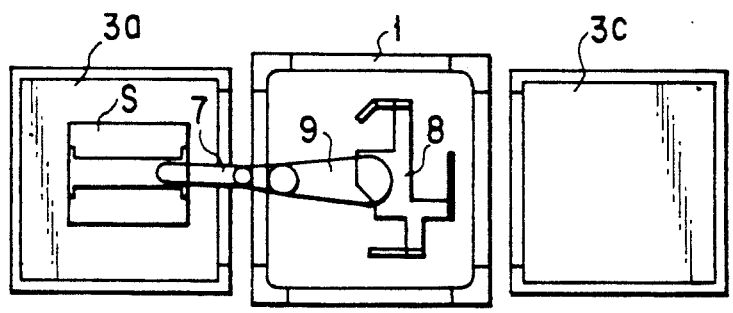
FIGS. 6A and 6E sequentially show how the arm and the storing member shown in FIG. 1 are operated.

As shown in FIG. 6A, the base 9 is rotated first to bring the arm 7 to a transferring position. In this example, the arm 7 is positioned in front of the process chamber 3a. Then, the arm 7 is stretched to put the substrate S on the third arm element 7c. In this step, the substrate S put on the pins 12 of the mount 11 is transferred onto the arm 7 by the vertical movement of the pins 12.

Figure 6B:
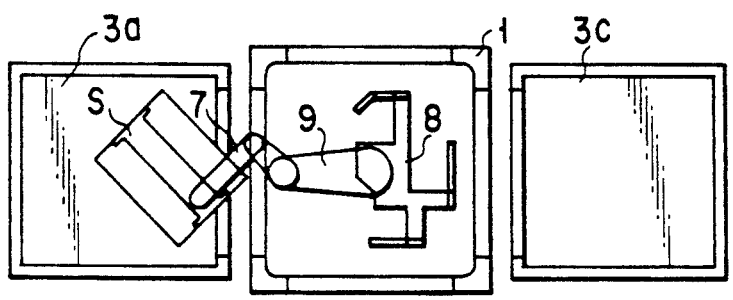
Figure 6C:
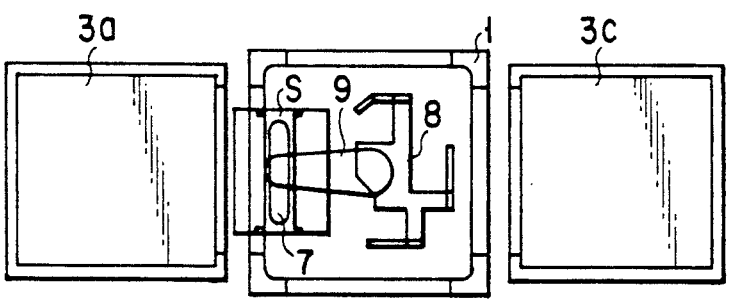
Figure 6D:
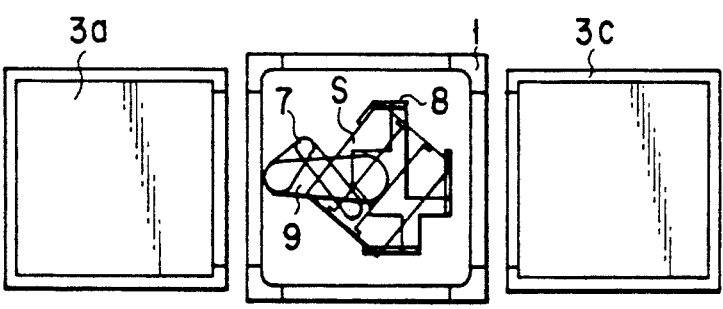

In the next step, the arm 7 is gradually folded as shown in FIGS. 6B to 6D to transfer the substrate S to reach the storing member 8. It should be noted that the height of the storing member 8 is determined in advance to select one of the flat levels, on which the substrate S is to be disposed, of the storing member 8. When the substrate S is transferred to the storing member 8, the vertical position of the storing member 8 is determined such that the selected level of the storing member is positioned somewhat lower than the lower surface of the substrate S. When the substrate S is transferred to the storing member 8, the substrate S is transferred from the arm 7 onto the supporting plates of the selected level by an upward movements of the storing member 8.

Figure 6E:
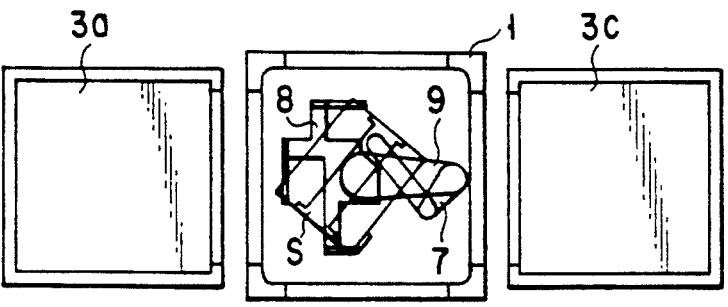

Then, the base 9 is rotated to permit the arm 7 to be positioned in front of the process chamber 3c, as shown in FIG. 6E. If another substrate after treatment is left within the process chamber 3c in this stage, the treated or processed substrate is taken out of the process chamber 3c by the arm 7, as in the steps shown in FIGS. 6A to 6D. The substrate taken out of the process chamber 3c is transferred onto the supporting plates of another level by vertically moving the storing member 8. Then, the substrate carried from the process chamber 3a is put into the process chamber 3c and disposed on the mount 11.

Suppose an etching treatment is applied to the substrate in the vacuum processing apparatus shown in the drawings. In this case, the mount 11 arranged in each of the process chambers 3a, 3b and 3c acts as a lower electrode. In applying an etching treatment to the substrate, it is necessary to put the substrate S accurately in a predetermined direction and at a predetermined position on the lower electrode. However, it may happen that one of the lower electrodes in the three process chambers is deviated from the predetermined position. In such a case, the amount of deviation is detected in advance by a teaching process. On the basis of the detection, the substrate supporting position of the arm 7 in the step of putting the substrate on the storing member 8 is deviated from the substrate supporting position of the arm 7 in the step of receiving the substrate from the storing member 8. It is possible to control as desired the position of the substrate on the lower electrode by suitably adjusting the amount of deviation noted. Incidentally, this adjustment can be controlled by a software of a computer serving to control the movement of the arm 7.

Let us describe how to operate the entire vacuum processing apparatus with reference to FIG. 1. In the first step, two LCD substrates are simultaneously taken out of the cassette 5a by operating the arms 15a and 15b of the transfer member 6. Then, the arms 15a and 15b are rotated by 90° toward the second load lock chamber 2 and stopped in front of the second load lock chamber 2. In this stage, two LCD substrates are simultaneously transferred onto the racks 22 within the second load lock chamber 2 by operating the arms 15a and 15b.

In the next step, the air within the second load lock chamber 2 is discharged to set up a predetermined degree of vacuum within the second load lock chamber 2. At the same time, the two substrates disposed on the racks 22 are aligned by the positioners 24. Under this condition, the gate 4 between the first load lock chamber 1 and the second load lock chamber 2 is opened, and the two substrates within the second load lock chamber 2 are successively transferred by the arm 7 into the storing member 8 positioned behind the arm 7.

Then, one of the substrates is transferred by the arm 7 from the first load lock chamber 1 into a predetermined one of the process chambers 3a, 3b and 3c for applying a predetermined treatment to the substrate. The substrate may be successively transferred into these process chambers 3a, 3b and 3c for applying different treatments such as an etching treatment and an ashing treatment to the substrate. It is also possible to apply the same treatment simultaneously to a plurality of substrates in these process chambers.

Where a large number of LCD substrates are treated continuously no matter which of the different treatments or the same treatment may be applied in these process chambers 3a, 3b and 3c, the substrate after treatment is taken out of these process chambers, followed by supplying another substrate into these process chambers for the treatment thereof. In this step, the substrate to be treated is disposed in advance on a predetermined level of the storing member 8. On the other hand, the substrate after treatment is disposed on another level of the storing member 8. It follows that the apparatus of the present invention permits putting and taking the substrate in and out of the process chamber in a short time substantially equal to that of the conventional apparatus comprising a plurality of arms 7.

After completion of all the treatments applied to the substrate, the substrate S is transferred into the second load lock chamber 2 by the arm 7. Then, the substrate S is transferred by the transfer member 6 from the second load lock chamber 2 to the outside so as to be housed in the cassette 5b.

As described above, the vacuum processing apparatus of the present invention comprises the storing member 8, making it possible to put and take the LCD substrate S in and out of the process chamber in a short time substantially equal to that of the conventional apparatus comprising a plurality of arms 7. Naturally, the particular construction of the present invention permits improving the through-put of the workpiece such as an LCD substrate. What should also be noted is that the particular construction of the present invention makes it possible to diminish the inner volumes of the first load lock chamber 1 and the first to third process chambers 3a to 3c, compared with the conventional apparatus comprising a plurality of arms 7. It is also possible to diminish the open area of the gate valve 4. It follows that the present invention permits suppressing the enlargement of the apparatus and suppressing the increase in the manufacturing cost.

Figure 7:
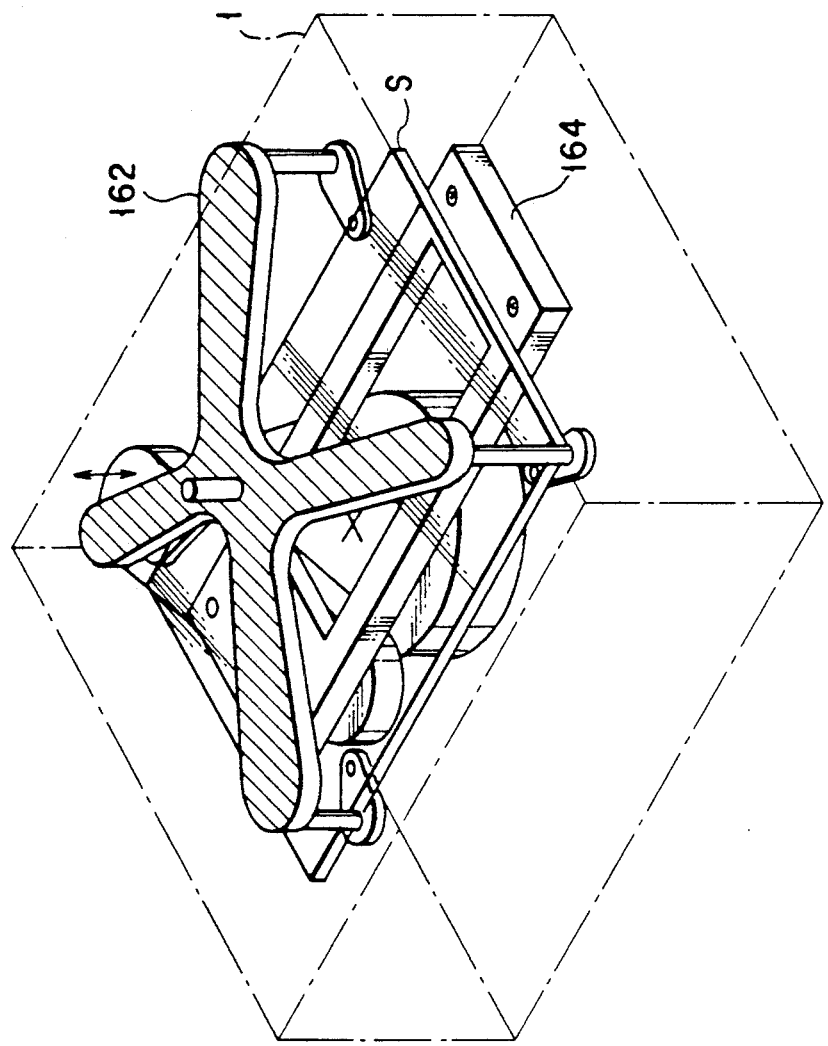
FIG. 7 is a perspective view schematically showing a modification of the arm.

FIG. 7 shows a storing member 162, which is a modification of the storing member included in the apparatus described above. As seen from the drawing, the storing member 162 is supported by a ceiling portion of the first load lock chamber 1 above an arm 164 which is substantially equal in its function to the substrate transfer arm 7. The storing member 162 is rotatable in synchronism with the rotation of the arm 164 and is movable in the vertical direction.

The embodiment shown in FIG. 7 permits further miniaturizing the first load lock chamber 1, leading to a further cost saving. A single LCD substrate S alone can be supported by the storing member 162. Thus, the time required for putting and taking the substrate in and out of the process chamber is longer than in the embodiment described previously. However, the time in question is shorter than in the case where a storing member is not included in the apparatus, leading to a shortened operating time and, thus, to an improved through-put.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A vacuum processing apparatus, comprising:
    a first process chamber in which a treatment is applied to a substrate to be processed under an atmosphere of a reduced pressure;
    a first mount for supporting the substrate within said first process chamber;
    a second process chamber in which a treatment is applied to the substrate under an atmosphere of a reduced pressure;
    a second mount for supporting the substrate within said second process chamber;
    a load lock chamber connected via a gate to each of said first and second process chambers;
    a storing member for holding the substrate within said load lock chamber;
    a retractable arm arranged within said load lock chamber for transferring the substrate among said first and second mounts and said storing member; and
    an arm support member supporting said arm and serving to drive said arm to selectively face said first and second process chambers.

2. The apparatus according to claim 1, further comprising:
    a waiting section connected to said load lock chamber via a gate for the substrate to be ready; and
    a holding member arranged within said waiting section for holding said substrate ready;
    wherein said arm transfers the substrate among the first and second mounts, said holding member and said storing member.

3. The apparatus according to claim 2, wherein said arm support member comprises a member integrally rotatable together with said arm.

4. The apparatus according to claim 3, wherein said storing member is supported by said arm support member and is integrally rotatable together with said arm.

5. The apparatus according to claim 4, wherein said storing member has a plurality of levels for supporting a plurality of substrates.

6. The apparatus according to claim 5, further comprising driving means for driving said storing member in a vertical direction in relation to said arm support member, said storing member being supported by said arm support member through said driving means.

7. The apparatus according to claim 6, wherein said arm and said storing member are arranged to face each other with the axis of rotation of said arm support member interposed therebetween.

8. The apparatus according to claim 7, further comprising a third process chamber in which a treatment is applied to the substrate under an atmosphere of a reduced pressure, said third process chamber being connected to said load lock chamber via a gate, and a third mount for supporting the substrate within said third process chamber, wherein said first, second, third process chambers and said waiting section are arranged around said load lock chamber apart from each other by 90°.

9. The apparatus according to claim 8, wherein said waiting section is formed within an auxiliary load lock chamber.

10. The apparatus according to claim 1, wherein a portion for carrying the substrate is formed at the tip of said arm.

11. A vacuum processing apparatus, comprising:
a process chamber in which a treatment is applied to a substrate to be processed under an atmosphere of a reduced pressure;
a mount for supporting the substrate within said process chamber;
a waiting section for the substrate to be ready;
a holding member arranged within said waiting section for holding the substrate ready;
a load lock chamber connected via a gate to each of said processing chamber and said waiting section;
a storing member for holding the substrate within said load lock chamber, said storing member having a plurality of levels for supporting a plurality of substrates;
a retractable arm arranged within said load lock chamber for transferring the substrate among said mount, said holding member and said storing member;
an arm support member supporting said storing member and said arm and rotatable together with these storing member and arm, said arm support member serving to drive said arm to selectively face said process chamber and said waiting section; and
driving means for driving said storing member in a vertical direction in relation to said arm support member, said storing member being supported by said arm support member through said driving means.

12. The apparatus according to claim 11, wherein said arm and said storing member are arranged to face each other with the axis of rotation of said arm support member interposed therebetween.

13. The apparatus according to claim 11, wherein said waiting section is formed within an auxiliary load lock chamber.

14. The apparatus according to claim 11, wherein a portion for carrying the substrate is formed at the tip of said arm.

15. The apparatus according to claim 11, wherein each of said mount and said holding member is provided with supporting means for moving the substrate in the vertical direction, and said supporting means is arranged not to interfere with said arm when said arm is stretched.

16. The apparatus according to claim 11, wherein said waiting section further comprises a positioner for aligning the substrate on the holding member.

* * * * *